(12) United States Patent
Noma et al.

(10) Patent No.: US 8,102,039 B2
(45) Date of Patent: Jan. 24, 2012

(54) SEMICONDUCTOR DEVICE AND MANUFACTURING METHOD THEREOF

(75) Inventors: Takashi Noma, Ota (JP); Yuichi Morita, Yokosuka (JP); Hiroshi Yamada, Ebina (JP); Kazuo Okada, Ota (JP); Katsuhiko Kitagawa, Ota (JP); Noboru Okubo, Kumagaya (JP); Shinzo Ishibe, Gunma (JP); Hiroyuki Shinogi, Gifu (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 245 days.

(21) Appl. No.: 12/376,917

(22) PCT Filed: Aug. 2, 2007

(86) PCT No.: PCT/JP2007/065575
§ 371 (c)(1),
(2), (4) Date: Mar. 25, 2009

(87) PCT Pub. No.: WO2008/018524
PCT Pub. Date: Feb. 14, 2008

(65) Prior Publication Data
US 2010/0164086 A1    Jul. 1, 2010

(30) Foreign Application Priority Data

Aug. 11, 2006 (JP) .................................. 2006-220100

(51) Int. Cl.
*H01L 23/02* (2006.01)
(52) U.S. Cl. ...................... 257/680; 257/686; 257/684
(58) Field of Classification Search ........... 257/679–733
See application file for complete search history.

(56) References Cited

U.S. PATENT DOCUMENTS 3,648,131 A   3/1972   Stuby
(Continued)

FOREIGN PATENT DOCUMENTS

EP   1 471 571   10/2004
(Continued)

OTHER PUBLICATIONS

Kitagawa et al., U.S. Office Action mailed Nov. 18, 2010, directed to U.S. Appl. No. 11/942,506; 8 pages.

(Continued)

*Primary Examiner* — Zandra Smith
*Assistant Examiner* — Telly Green
(74) *Attorney, Agent, or Firm* — Morrison & Foerster LLP

(57) ABSTRACT

This invention is directed to offer a package type semiconductor device that can realize a smaller size device and its manufacturing method as well as a small stacked layer type semiconductor device and its manufacturing method. A device component 1 and a pad electrode 4 electrically connected with the device component 1 are formed on a semiconductor substrate 2. A supporting member 7 is bonded to a surface of the semiconductor substrate 2 through an adhesive layer 6. There is formed a through-hole 15 in the supporting member 7 penetrating from its top surface to a back surface. Electrical connection with another device is made possible through the through-hole 15. A depressed portion 12 is formed in a partial region of the top surface of the supporting member 7. Therefore, all or a portion of another device or a component can be disposed utilizing a space in the depressed portion 12. When a stacked layer type semiconductor device is formed, stacking is made by fitting a portion of a semiconductor device 50 in an upper layer to an inside of the depressed portion 12.

8 Claims, 10 Drawing Sheets

U.S. PATENT DOCUMENTS

| | | | |
|---|---|---|---|
| 4,807,021 A | 2/1989 | Okumura | |
| 4,851,481 A | 7/1989 | Kuriyama et al. | |
| 4,954,875 A | 9/1990 | Clements | |
| 4,984,358 A | 1/1991 | Nelson | |
| 5,229,647 A | 7/1993 | Gnadinger | |
| 5,420,460 A | 5/1995 | Massingill | |
| 5,424,245 A | 6/1995 | Gurtler et al. | |
| 5,432,999 A | 7/1995 | Capps et al. | |
| 5,463,246 A | 10/1995 | Matsunami | |
| 5,608,264 A | 3/1997 | Gaul | |
| 5,618,752 A | 4/1997 | Gaul | |
| 5,646,067 A | 7/1997 | Gaul | |
| 5,814,889 A | 9/1998 | Gaul | |
| 5,841,197 A | 11/1998 | Adamic, Jr. | |
| 5,872,025 A | 2/1999 | Cronin et al. | |
| 6,087,719 A | 7/2000 | Tsunashima | |
| 6,124,179 A | 9/2000 | Adamic, Jr. | |
| 6,322,903 B1 | 11/2001 | Siniaguine et al. | |
| 6,350,386 B1 | 2/2002 | Lin | |
| 6,350,632 B1 | 2/2002 | Lin | |
| 6,383,837 B1 | 5/2002 | Tsunashima | |
| 6,388,333 B1 | 5/2002 | Taniguchi et al. | |
| 6,420,209 B1 | 7/2002 | Siniaguine | |
| 6,437,424 B1 | 8/2002 | Noma et al. | |
| 6,440,835 B1 | 8/2002 | Lin | |
| 6,444,489 B1 | 9/2002 | Lin | |
| 6,448,108 B1 | 9/2002 | Lin | |
| 6,448,647 B1 | 9/2002 | Kurita et al. | |
| 6,451,626 B1 | 9/2002 | Lin | |
| 6,461,956 B1 | 10/2002 | Hsuan et al. | |
| 6,492,252 B1 | 12/2002 | Lin et al. | |
| 6,509,639 B1 | 1/2003 | Lin | |
| 6,522,022 B2 | 2/2003 | Murayama | |
| 6,537,851 B1 | 3/2003 | Lin et al. | |
| 6,544,813 B1 | 4/2003 | Lin | |
| 6,548,393 B1 | 4/2003 | Lin | |
| 6,552,426 B2 | 4/2003 | Ishio et al. | |
| 6,576,493 B1 | 6/2003 | Lin et al. | |
| 6,576,539 B1 | 6/2003 | Lin | |
| 6,583,040 B1 | 6/2003 | Lin | |
| 6,608,374 B1 | 8/2003 | Lin et al. | |
| 6,627,824 B1 | 9/2003 | Lin | |
| 6,639,303 B2 | 10/2003 | Siniaguine | |
| 6,653,170 B1 | 11/2003 | Lin | |
| 6,653,217 B1 | 11/2003 | Lin | |
| 6,653,742 B1 | 11/2003 | Lin | |
| 6,664,129 B2 | 12/2003 | Siniaguine | |
| 6,667,229 B1 | 12/2003 | Lin et al. | |
| 6,699,780 B1 | 3/2004 | Chiang et al. | |
| 6,717,254 B2 | 4/2004 | Siniaguine | |
| 6,740,576 B1 | 5/2004 | Lin et al. | |
| 6,765,287 B1 | 7/2004 | Lin | |
| 6,794,741 B1 | 9/2004 | Lin et al. | |
| 6,809,414 B1 | 10/2004 | Lin et al. | |
| 6,809,421 B1 | 10/2004 | Hayasaka et al. | |
| 6,844,241 B2 | 1/2005 | Halahan et al. | |
| 6,864,172 B2 | 3/2005 | Noma et al. | |
| 6,882,030 B2 | 4/2005 | Siniaguine | |
| 6,897,148 B2 | 5/2005 | Halahan et al. | |
| 6,908,788 B1 | 6/2005 | Lin | |
| 6,982,487 B2 | 1/2006 | Kim et al. | |
| 7,001,825 B2 | 2/2006 | Halahan et al. | |
| 7,009,297 B1 | 3/2006 | Chiang et al. | |
| 7,015,128 B1 | 3/2006 | Chiang et al. | |
| 7,067,911 B1 | 6/2006 | Lin et al. | |
| 7,071,089 B1 | 7/2006 | Lin et al. | |
| 7,071,573 B1 | 7/2006 | Lin | |
| 7,075,186 B1 | 7/2006 | Wang et al. | |
| 7,094,676 B1 | 8/2006 | Leu et al. | |
| 7,101,735 B2 | 9/2006 | Noma et al. | |
| 7,102,238 B2 | 9/2006 | Noma et al. | |
| 7,112,520 B2 | 9/2006 | Lee et al. | |
| 7,112,521 B1 | 9/2006 | Lin et al. | |
| 7,112,881 B2 | 9/2006 | Kaida et al. | |
| 7,115,972 B2 | 10/2006 | Dotta et al. | |
| 7,122,457 B2 | 10/2006 | Tanida et al. | |
| 7,129,113 B1 | 10/2006 | Lin et al. | |
| 7,129,575 B1 | 10/2006 | Lin et al. | |
| 7,132,741 B1 | 11/2006 | Lin et al. | |
| 7,190,080 B1 | 3/2007 | Leu et al. | |
| 7,208,340 B2 | 4/2007 | Noma | |
| 7,232,706 B1 | 6/2007 | Wang et al. | |
| 7,232,707 B1 | 6/2007 | Wang et al. | |
| 7,271,466 B2 | 9/2007 | Noma et al. | |
| 7,312,107 B2 | 12/2007 | Noma et al. | |
| 7,312,521 B2 | 12/2007 | Noma et al. | |
| 7,319,265 B1 | 1/2008 | Wang et al. | |
| 7,371,693 B2 | 5/2008 | Suzuki et al. | |
| 7,397,134 B2 | 7/2008 | Noma | |
| 7,413,931 B2 | 8/2008 | Noma et al. | |
| 7,414,319 B2 | 8/2008 | Lin et al. | |
| 7,419,851 B2 | 9/2008 | Lin et al. | |
| 7,456,083 B2 | 11/2008 | Noma et al. | |
| 2003/0214048 A1 | 11/2003 | Wu et al. | |
| 2004/0041260 A1 | 3/2004 | Wood et al. | |
| 2004/0235270 A1 | 11/2004 | Noma et al. | |
| 2004/0245530 A1 | 12/2004 | Kameyama et al. | |
| 2005/0003649 A1 | 1/2005 | Takao | |
| 2005/0176235 A1 | 8/2005 | Noma et al. | |
| 2005/0253211 A1 | 11/2005 | Minamio et al. | |
| 2006/0131736 A1* | 6/2006 | Jansman et al. | 257/712 |
| 2007/0071970 A1 | 3/2007 | Koike et al. | |
| 2007/0131954 A1* | 6/2007 | Murayama et al. | 257/98 |
| 2007/0177360 A1* | 8/2007 | Shiraishi et al. | 361/740 |
| 2007/0210437 A1* | 9/2007 | Noma et al. | 257/690 |
| 2008/0135967 A1* | 6/2008 | Kitagawa et al. | 257/434 |
| 2009/0290474 A1 | 11/2009 | Kimura et al. | |
| 2010/0326429 A1 | 12/2010 | Cumpston et al. | |

FOREIGN PATENT DOCUMENTS

| | | |
|---|---|---|
| JP | 10-163250 A1 | 6/1998 |
| JP | 2001-85603 | 3/2001 |
| JP | 2001-223297 A | 8/2001 |
| JP | 2002-512436 A1 | 4/2002 |
| JP | 2003-234431 | 8/2003 |
| JP | 2004-273561 A | 9/2004 |
| JP | 2004-281963 | 10/2004 |
| JP | 2004-363380 | 12/2004 |
| JP | 2005-072554 A | 3/2005 |
| JP | 2005-79457 | 3/2005 |
| JP | 2005-123553 A | 5/2005 |
| JP | 2005-268701 | 9/2005 |
| JP | 2005-327893 | 11/2005 |
| JP | 2006-179718 | 7/2006 |
| JP | 2006-216657 | 8/2006 |
| JP | 2007-242813 | 9/2007 |
| WO | WO-99/40624 A1 | 8/1999 |

OTHER PUBLICATIONS

International Search Report, mailed Oct. 30, 2007, directed to counterpart International Patent Application No. PCT/JP2007/065575; 3 pages.

Noma et al., U.S. Office Action mailed May 20, 2010, directed to U.S. Appl. No. 11/714,906; 11 pages.

Kitagawa et al., U.S. Office Action mailed Jun. 21, 2010, directed to U.S. Appl. No. 11/942,506; 8 pages.

Partial European Search Report mailed Oct. 23, 2007 directed to related EP Application No. 07004724.6.

Noma et al., U.S. Office Action mailed Aug. 7, 2009, directed to U.S. Appl. No. 11/714,906; 24 pages.

Kitagawa, K. et al., U.S. Office Action mailed Jun. 24, 2011, directed to U.S. Appl. No. 11/942,506; 8 pages.

Kitagawa, K. et al., U.S. Office Action mailed Nov. 25, 2011, directed to U.S. Appl. No. 11/942,506; 9 pages.

* cited by examiner

US 8,102,039 B2

SEMICONDUCTOR DEVICE AND MANUFACTURING METHOD THEREOF

REFERENCE TO RELATED APPLICATIONS

This application is a national stage application under 35 USC 371 of International Application No. PCT/JP2007/065575, filed Aug. 2, 2007, which claims priority from Japanese Patent Application No. 2006-220100, filed Aug. 11, 2006, the contents of which are incorporated herein by reference.

FIELD OF THE INVENTION

This invention relates to a semiconductor device, specifically to a package type semiconductor device and its manufacturing method.

DESCRIPTION OF THE RELATED ART

A CSP (Chip Size Package) has received attention in recent years as a new packaging technology. The CSP means a small package having about the same outside dimensions as those of a semiconductor die.

A BGA (Ball Grid Array) type semiconductor device has been known as a kind of CSP. The BGA type semiconductor device is provided with a plurality of ball-shaped conductive terminals that are electrically connected with pad electrodes disposed on a semiconductor substrate.

When the BGA type semiconductor device is mounted on electronic equipment, the semiconductor die is electrically connected with an external circuit on a printed circuit board by bonding the conductive terminals to wiring patterns on the printed circuit board.

Such BGA type semiconductor devices are widely used because they have advantages in providing a large number of conductive terminals and in reducing size over other CSP type semiconductor devices such as an SOP (Small Outline Package) and a QFP (Quad Flat Package), which have lead pins protruding from their sides.

FIG. 16 is a cross-sectional view showing an outline structure of a conventional BGA type semiconductor device 110. A device component 101 such as a CCD (Charge Coupled Device) type image sensor or a CMOS type image sensor is formed in a top surface of a semiconductor substrate 100 made of silicon or the like, and a pad electrode 102 is formed in addition through a first insulation film 103. A glass substrate 104, for example, is bonded to the top surface of the semiconductor substrate 100 through an adhesive layer 105 made of epoxy resin or the like. A second insulation film 106 made of a silicon oxide film or a silicon nitride film is formed on a side surface and a back surface of the semiconductor substrate 100.

A wiring layer 107 electrically connected with the pad electrode 102 is formed on the second insulation film 106. The wiring layer 107 is formed over the side surface and the back surface of the semiconductor substrate 100. A protection layer 108 made of solder resist or the like is formed to cover the second insulation film 106 and the wiring layer 107. Openings are formed in the protection film 108 on the wiring layer 107 at predetermined regions, and there are formed ball-shaped conductive terminals 109 electrically connected with the wiring layer 107 through the openings.

The technology mentioned above is disclosed in Japanese Patent Publication No. 2005-072554, for example.

The device incorporating the package type semiconductor device as described above is required to reduce its thickness and size as a whole.

When a stacked layer structure of completed semiconductor devices is implemented, it is also required to reduce a height of the stacked structure as much as possible to reduce size of the device as a whole. When the stacked layer type semiconductor device is formed by stacking a plurality of conventional semiconductor devices, however, there is a problem that the device as a whole becomes too large.

SUMMARY OF THE INVENTION

Thus, this invention is directed to offering a package type semiconductor device that can realize a reduced size device and its manufacturing method as well as a small stacked layer type semiconductor device and its manufacturing method.

This invention is directed to solving the problems addressed above and has following features. A semiconductor device of this invention is characterized by having a semiconductor substrate on a top surface of which an electronic component is formed, a supporting member a back surface of which faces the semiconductor substrate and is bonded to the semiconductor substrate through an adhesive layer and an electrode formed below the supporting member and electrically connected with the electronic component, wherein a depressed portion is formed in a partial region of a top surface of the supporting member.

Also, the semiconductor device of this invention is characterized by that there is formed a through-hole penetrating through the supporting member from the top surface to the back surface and that the electrode can be electrically connected with an electrode of another device through the through-hole.

Also, a semiconductor device of this invention is characterized by comprising a semiconductor substrate on a top surface of which an electronic component is formed, a supporting member a back surface of which faces the semiconductor substrate and is bonded to the semiconductor substrate through an adhesive layer, an electrode formed below the supporting member and electrically connected with the electronic component and a plurality of through-holes penetrating from a top surface of the supporting member to the back surface, wherein the plurality of through-holes comprises a through-hole that is provided in its hole with a first conductive terminal electrically connected with the electrode and a through-hole that is not provided with the first conductive terminal and is used to house a portion or all of another device.

Also, a semiconductor device of this invention is a stacked layer type semiconductor device that is formed by stacking a plurality of semiconductor devices, each of which comprises a semiconductor substrate on a top surface of which an electronic component is formed and a supporting member bonded to the surface of the semiconductor substrate through an adhesive layer, and is characterized by that the supporting member in the semiconductor device in a lower layer has a depressed portion or a through-hole in a partial region of its top surface and that all or a portion of the semiconductor device in an upper layer is housed in the depressed portion or in the through-hole.

Also, the semiconductor device of this invention is characterized by that the supporting member of the semiconductor device in the lower layer has a through-hole for connection with the electrode and that the semiconductor device in the lower layer is electrically connected with the semiconductor device in the upper layer through a conductive material formed in the through-hole for connection with the electrode.

Also, a manufacturing method of a semiconductor device of this invention is characterized by comprising providing a semiconductor substrate on a top surface of which an electronic component and an electrode electrically connected with the electronic component are formed, a process step to bond a supporting member to the top surface of the semiconductor substrate through an adhesive layer and a process step to form a depressed portion in a partial region of a top surface of the supporting member.

Also, the manufacturing method of the semiconductor device of this invention is characterized by comprising a process step to form a through-hole penetrating through the supporting member from its top surface to its back surface so as to expose a top surface of the electrode on a side of the supporting member and a process step to form a first conductive terminal electrically connected with the electrode.

Also, a manufacturing method of a semiconductor device of this invention is a method to manufacture a stacked layer type semiconductor device including a process step to vertically stack a plurality of semiconductor devices each of which comprises a semiconductor substrate on a top surface of which an electronic component and an electrode electrically connected with the electronic component are formed and a supporting member bonded to the top surface of the semiconductor substrate through an adhesive layer, and characterized by comprising a process step to form a depressed portion or a through-hole in a partial region of a top surface of the supporting member of the semiconductor device that makes a lower layer and a process step to stack an upper layer semiconductor device and the lower layer semiconductor device by housing all or a portion of the upper layer semiconductor device in the depressed portion or in the through-hole in the supporting member.

In this invention, the depressed portion or the through-hole is formed in the top surface of the supporting member that is bonded to the semiconductor substrate. As a result, all or a portion of another device or a component can be disposed utilizing a space in the depressed portion or the through-hole to reduce a thickness and a size of the device as a whole.

Also, the stacked layer type semiconductor device smaller than the conventional one can be obtained by using the semiconductor device having the depressed portion or the through-hole formed in its supporting member and by stacking so that all or a portion of the semiconductor device in the upper layer semiconductor device is housed in the depressed portion or the through-hole in the supporting member of the lower layer semiconductor device.

DETAILED DESCRIPTION OF THE INVENTION

Figure 1:
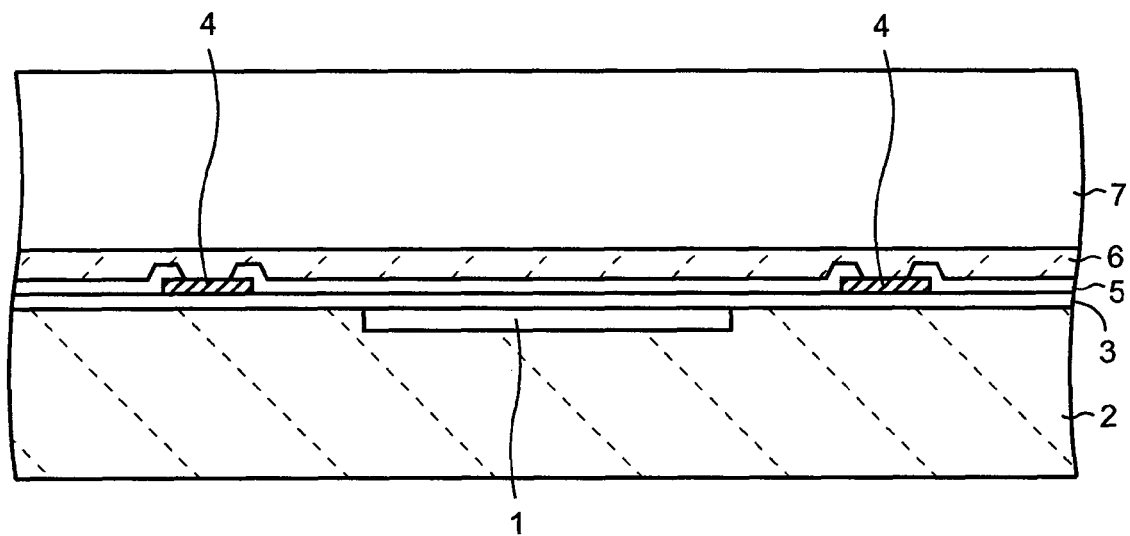
FIG. 1 is a cross-sectional view explaining a semiconductor device and its manufacturing method according to a first embodiment of this invention.

A first embodiment of this invention will be explained hereafter referring to the drawings. FIG. 1 through FIG. 7 are plan views and cross-sectional views presented in the order of manufacturing process steps.

First, as shown in FIG. 1, there is provided a semiconductor substrate 2, made of silicon (Si) or the like, on a top surface of which a device component 1 (a CCD, a light-receiving component such as an infrared sensor, a light-emitting component or other semiconductor component, for example) is formed. The semiconductor substrate 2 is about 300-700 μm thick, for example. A first insulation film 3 (a silicon oxide film formed by thermal oxidation or CVD, for example) of a thickness of 2 μm, for example, is formed on the top surface of the semiconductor substrate 2.

Next, a metal layer made of aluminum (Al), aluminum alloy or copper (Cu), for example, is formed by a sputtering method, a plating method or other film forming method, and thereafter the metal layer is etched using a resist layer (not shown) as a mask to form pad electrodes 4 of a thickness of 1 μm, for example, on the first insulation film 3. The pad electrodes 4 make electrodes for external connections, which are electrically connected with the device component 1 and its peripheral component through interconnections (not shown). Although the pad electrodes 4 are disposed on both sides of the device component 1 in FIG. 1, their locations are not restricted and they may be disposed above the device component 1.

Next, a passivation film 5 (a silicon nitride film formed by CVD, for example) that covers all or a portion of the pad electrode 4 is formed over the top surface of the semiconductor substrate 2. The passivation film 5 shown in FIG. 1 is formed so as to cover a portion of the pad electrode 4.

Next, a supporting member 7 is bonded to top the surface of the semiconductor substrate 2 including the pad electrodes 4 through an adhesive layer 6 made of epoxy resin, polyimide (photosensitive polyimide, for example), resist, acryl or the like. Out of surfaces of the supporting member 7, a principal surface facing the semiconductor substrate 2 is called a back surface, and another principal surface on the opposite side is called a top surface. The supporting member 7 may be a film-shaped protection tape, may be a rigid substrate made of glass, quartz, ceramics, metal or the like, or may be made of resin. It is preferable that the supporting member 7 is a rigid substrate for the purpose of firmly supporting the semiconductor substrate 2 that is to be reduced in thickness and accommodating hands-free automatic transfer. The supporting member 7 has a function of supporting the semiconductor substrate 2 as well as protecting a surface of the component. When the device component 1 is a light-receiving component or a light-emitting component, the supporting member 7 is to be made of a transparent or semitransparent material to permit light to pass through.

Next, back grinding using a back surface grinding apparatus (grinder) is applied to a back surface of the semiconductor substrate 2 to reduce the thickness of the semiconductor substrate 2 to a predetermined thickness (50 μm, for example). The back grinding may be replaced with etching, or with a combination of grinding and etching. The back grinding is not required in some cases, depending on usage or specifications of the finished product or an initial thickness of the semiconductor substrate 2 being provided.

Figure 2:
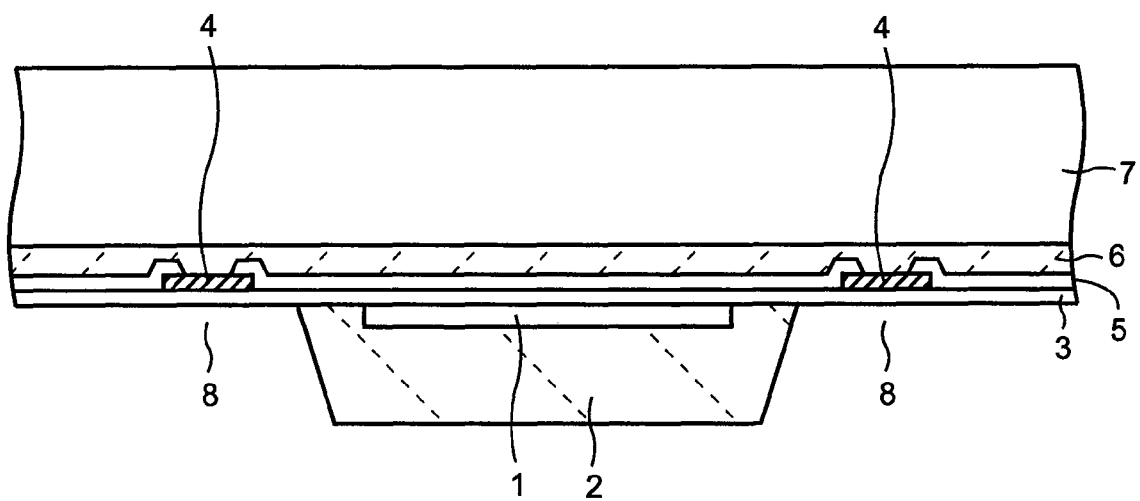
FIG. 2 is a cross-sectional view explaining the semiconductor device and its manufacturing method according to the first embodiment of this invention.

Next, predetermined regions of the semiconductor substrate 2 corresponding to the pad electrodes 4 are selectively etched off from a side of the back surface of the semiconductor substrate 2 to expose portions of the first insulation film 3, as shown in FIG. 2. The exposed portions are hereafter referred to as openings 8.

Figure 3A:
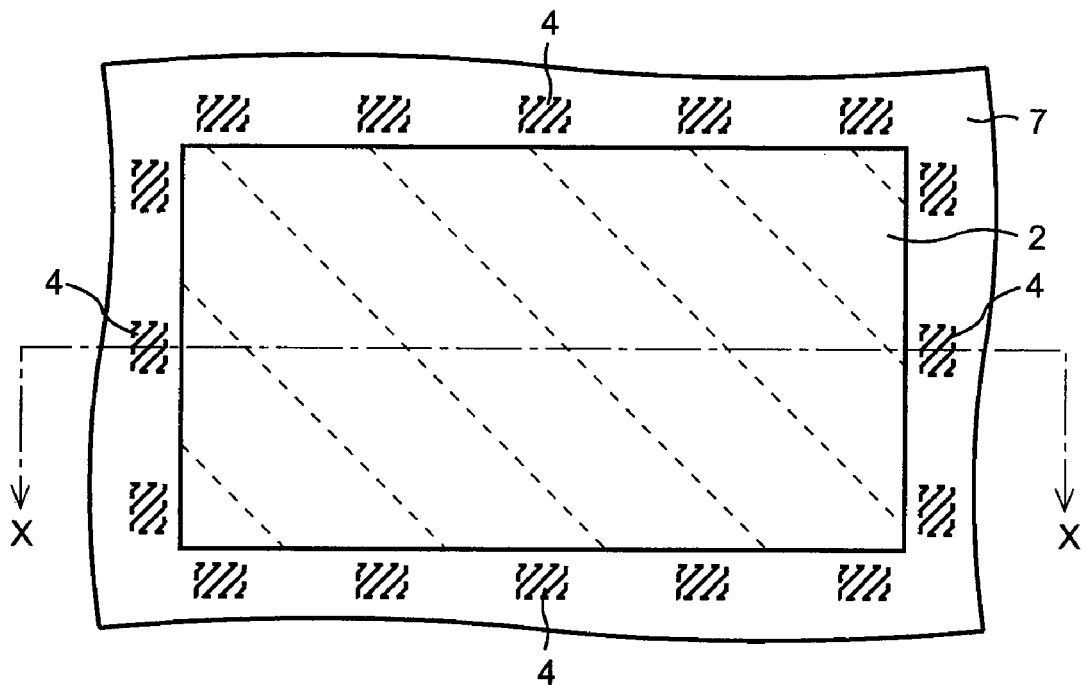
FIGS. 3A and 3B are plan views explaining the semiconductor device and its manufacturing method according to the first embodiment of this invention.
Figure 3B:
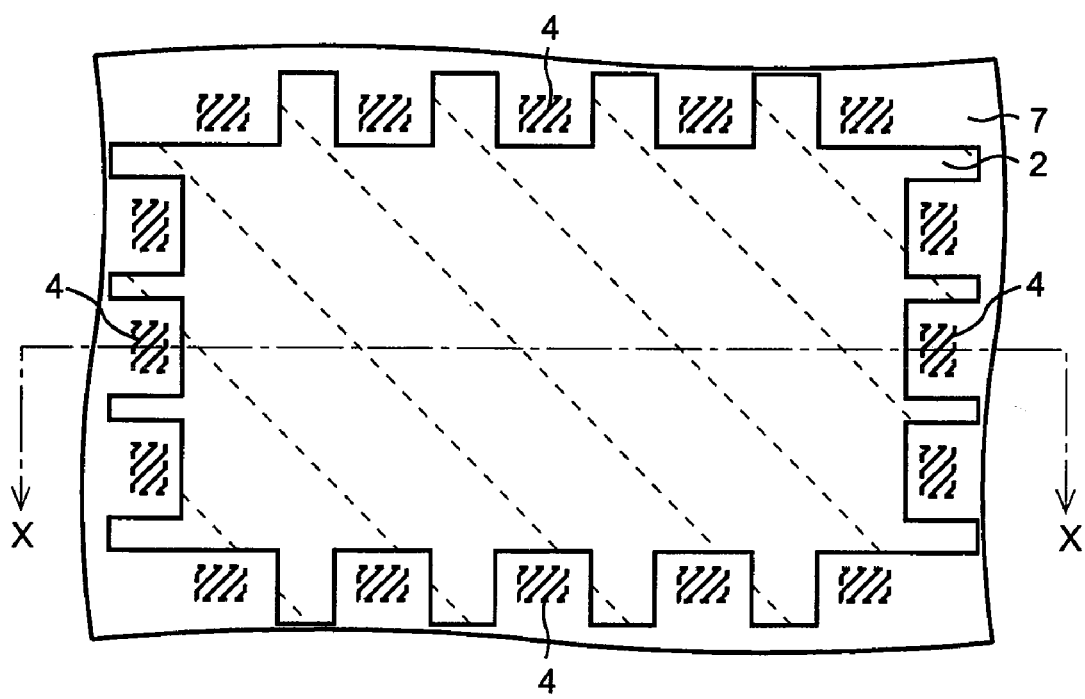

The selective etching of the semiconductor substrate 2 is explained referring to FIGS. 3A and 3B. FIGS. 3A and 3B are brief plan views looked from below (from a side of the semiconductor substrate 2). FIG. 2 corresponds to a cross-sectional view of a section X-X in FIGS. 3A and 3B.

The semiconductor substrate 2 may be etched to a shape which is roughly a rectangle that is narrower than a width of the supporting member 7, as shown in FIG. 3A. Or, the semiconductor substrate 2 may be shaped to have a rugged periphery by etching off the semiconductor substrate 2 only from regions, in which the pad electrodes 4 are formed, as shown in FIG. 3B. The latter has larger overlapping area between the semiconductor substrate 2 and the supporting member 7, and leaves the semiconductor substrate 2 extended closer to a periphery of the supporting member 7. Therefore, a structure of the latter is more preferable in terms of enhancing the strength of the supporting member 7 to bolster the semiconductor substrate 2. Also, cracks and separation of the semiconductor substrate 2 can be prevented since warping of the supporting member 7 due to a difference in a coefficient of thermal expansion between the semiconductor substrate 2 and the supporting member 7 can be prevented with the latter structure. It is also possible to design the semiconductor substrate 2 in a shape different from either of the planar shapes shown in FIGS. 3A and 3B.

Although the semiconductor substrate 2 is etched in a way that sidewalls of the semiconductor substrate 2 are tapered so that a width of the semiconductor substrate 2 is increased toward the top surface in this embodiment, the semiconductor substrate 2 may also be etched in a way that the sidewalls of the semiconductor substrate 2 are perpendicular to a principal surface of the supporting member 7 to keep the width of the semiconductor substrate 2 constant.

Figure 4:
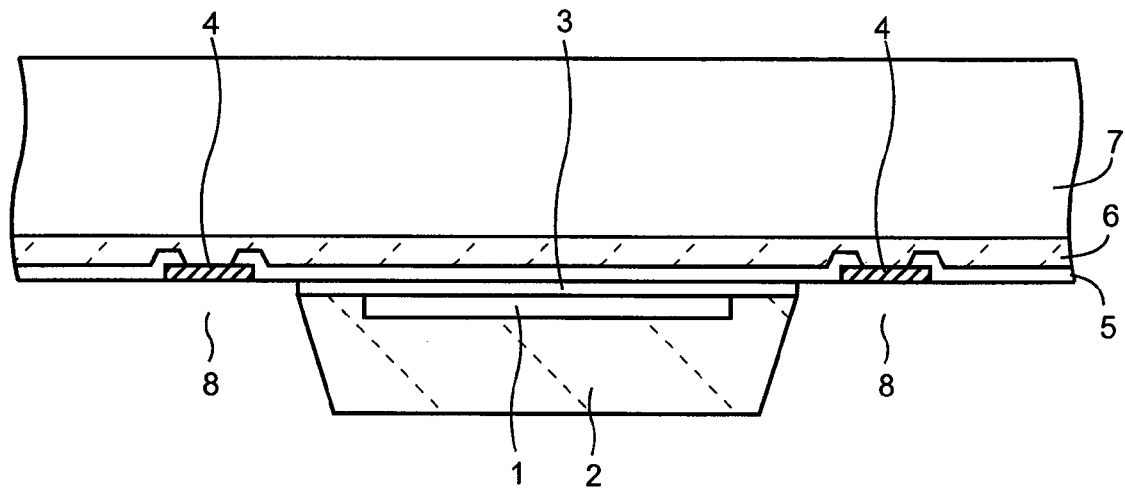
FIG. 4 is a cross-sectional view explaining the semiconductor device according to the first embodiment of this invention.

Next, the first insulation film 3 is selectively etched using the semiconductor substrate 2 as a mask, as shown in FIG. 4.

The first insulation film 3 in a region between an edge of the semiconductor substrate 2 and a predetermined dicing line is removed by the etching to expose a surface (a surface of the side of the semiconductor substrate 2) of the pad electrode 4 at a bottom of the opening 8. A resist layer may be formed to be used as the mask in the etching.

Figure 5:
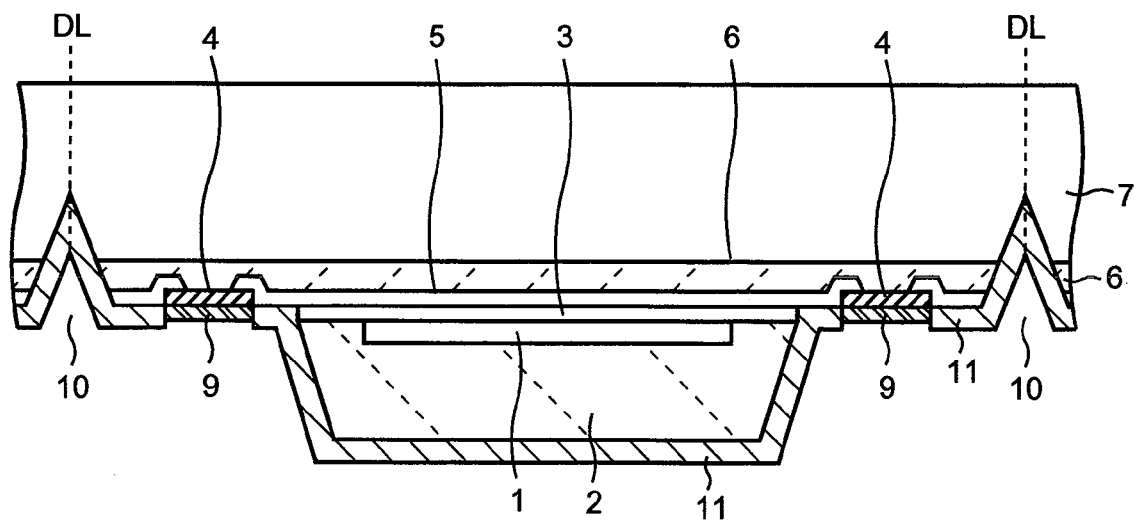
FIG. 5 is a cross-sectional view explaining the semiconductor device and its manufacturing method according to the first embodiment of this invention.

Next, a metal layer 9 is formed on the exposed surface of the pad electrode 4, as shown in FIG. 5. The metal layer 9 is made of stacked layers of a nickel (Ni) layer and a gold (Au) layer, for example, and is formed by a lift-off method, that is, sputtering these metals sequentially using a resist layer as a mask followed by removing the resist layer, or by a plating method.

The materials to form the metal layer 9 may be modified as appropriate. That is, the metal layer 9 may be made of a titanium (Ti) layer, a tungsten (W) layer, a copper (Cu) layer, a tin (Sn) layer or the like, other than the nickel layer and the gold layer. The metal layer 9 may be made of any material as long as the material has functions to electrically connect the pad electrode 4 with a conductive terminal 25, which is to be described, or with an electrode of another device and to protect the pad electrode 4, and may be made of a single layer or stacked layers. Examples of the stacked layers are nickel/gold layers, titanium/nickel/copper layers, titanium/nickel-vanadium/copper layers and the like.

Next, portions of the supporting member 7 are removed from the side of the semiconductor substrate 2 by a dicing blade or etching to form V-shaped grooves (notches) 10 along the dicing lines DL. In some cases, the V-shaped grooves 10 are not formed.

Next, there is formed a protection layer 11 of a thickness of 10 μm, for example, having openings at locations corresponding to the pad electrode 4 and the metal layer 9. The opening is formed on a principal surface of the pad electrode 4 on the side of the semiconductor substrate 2.

The protection layer 11 is formed as described below, for example. First, an organic material such as polyimide resin, solder resist or the like is applied over the entire surface by a coating method and a thermal treatment (pre-bake) is performed. Then, the applied organic material is exposed to light and developed to form the openings that expose a surface of the metal layer 9. After that, another thermal treatment (post-bake) is performed to obtain the protection layer 11 having the openings at the locations corresponding to the pad electrode 4 and the metal layer 9. When the V-shaped grooves 10 are formed, portions (side surface) of the supporting member 7 are also covered with the protection layer 11. As a result, infiltration of corrosive material is reduced.

Figure 6:
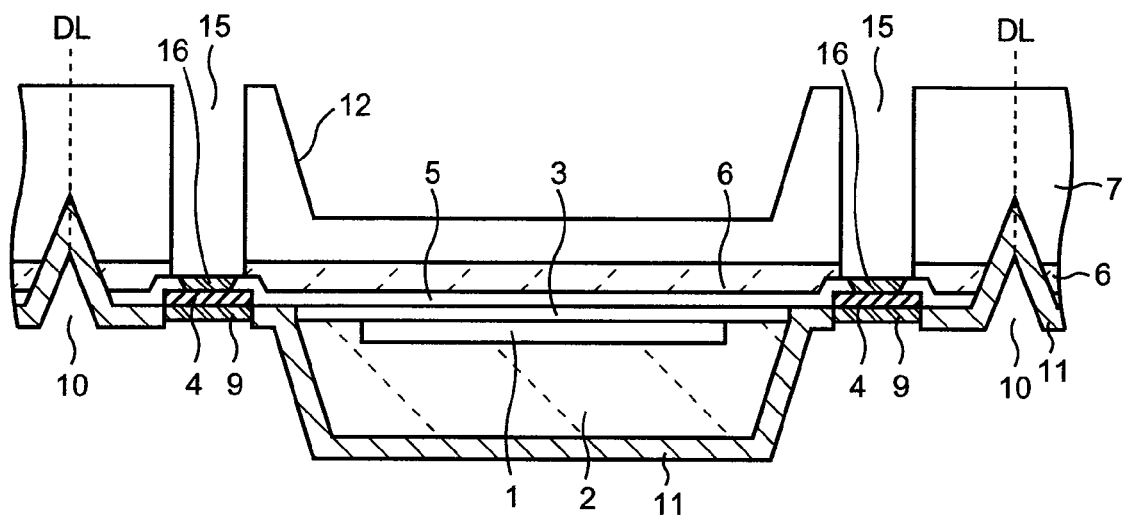
FIG. 6 is a cross-sectional view explaining the semiconductor device and its manufacturing method according to the first embodiment of this invention.

Next, a depressed portion 12 that is roughly horizontal at its bottom is formed in a partial region of the top surface of the supporting member 7, as shown in FIG. 6. To be more specific, a resist layer (not shown) having an opening in the region where the depressed portion 12 is to be formed is formed on the supporting member 7, and the top surface of the supporting member 7 is dry-etched in the direction of thickness using the resist layer as a mask to form the depressed portion 12, for example. Or, the depressed portion 12 may be formed by removing the top surface of the supporting member 7 by laser irradiation, wet etching or micro-blasting. The micro-blasting is a method to process an object by blasting the object with fine particles of alumina, silica or the like. The depressed portion 12 does not penetrate through the supporting member 7 and its bottom is located partway through the thickness of the supporting member 7.

Although a depth, a width and a horizontal shape of the depressed portion 12 are arbitrary, it is preferable for obtaining a stacked layer type semiconductor device of a minimum size that the depressed portion 12 is formed so that all of the semiconductor substrate 2 including the protection layer 12 is housed in the depressed portion 12. This point will be explained later.

Also, as will be explained later, since an electronic device (a MEMS component, for example) or a component (a filter or a lens, for example) can be also disposed on the bottom of the depressed portion 12 utilizing its space, the depth, the width and the like of the depressed portion 12 are adjusted to what is disposed there in that case.

Next, through-holes 15 that penetrate through the supporting member 12 and expose the pad electrodes 4 from a side of the supporting member 7 are formed at locations corresponding to the pad electrodes 4 in regions where the depressed portion 12 is not formed. To be more specific, a resist layer (not shown) that has openings in the regions where the through-holes 15 are to be formed is formed on the supporting member 7. Then, the supporting member 7 is selectively etched using the resist layer as a mask to expose the adhesive layer 6, followed by etching of the adhesive layer 6 to form the through-holes 15. The through-holes 15 may be formed by dip-etching using hydrofluoric acid (HF) as an etching solution. Or, the through-holes 15 may be formed by dry-etching, laser irradiation, micro-blasting or the like.

The through-hole 15 is roughly a square in shape with each side of about 100 μm, for example, when looked from above. In this embodiment, the through-hole 15 is formed in a region that is displaced toward inside by a predetermined distance from the dicing line DL. As a result, a periphery of the through-hole 15 is surrounded by the supporting member 7 after dicing. The through-hole 15 may also be formed adjacent the dicing line DL so that it is exposed to outside of the supporting member 7 after the dicing.

Next, a metal layer 16 is formed on the pad electrode 4 exposed at the bottom of the through-hole 15 (on a surface of the pad electrode 4 on the side of the supporting member 7). The metal layer 16 is similar in the structure to the metal layer 9 that has been described previously, and is made of a nickel (Ni) layer and a gold (Au) layer stacked consecutively, for example. As a result, each of the metal layers 9 and 16 is formed on each of two principal surfaces of the pad electrode 4, respectively.

Figure 7:
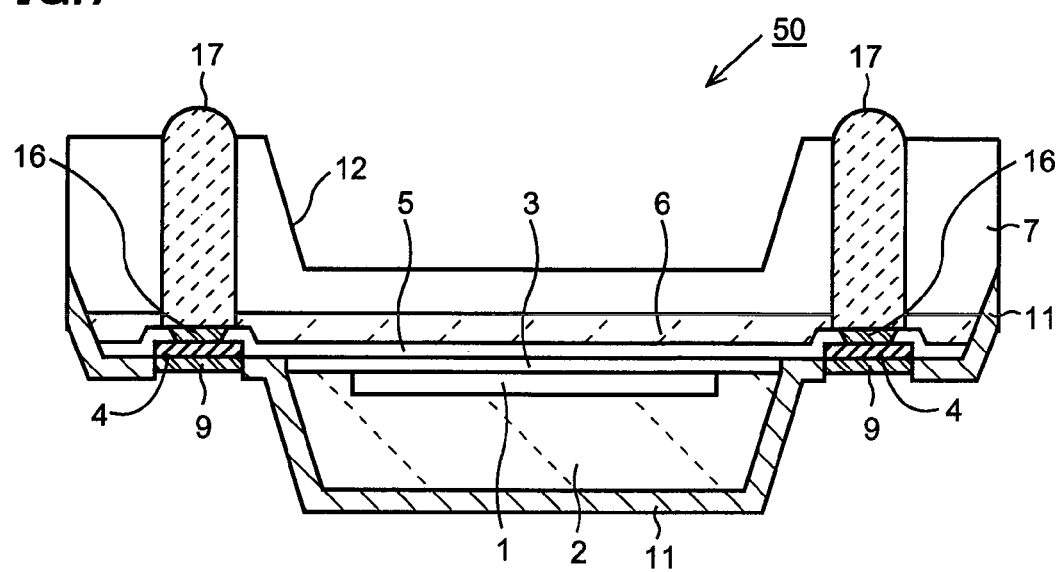
FIG. 7 is a cross-sectional view explaining the semiconductor device and its manufacturing method according to the first embodiment of this invention.

Next, a conductive material (solder, for example) is screen-printed on the metal layer 16 in the through-hole 15, and conductive terminals 17 are formed by subsequent thermal treatment to reflow the conductive material, as shown in FIG. 7. The conductive terminals 17 are formed at locations corresponding to the pad electrodes 4 along the periphery of the supporting member 7. Also, the conductive terminals 17 are formed to be higher than a height of the supporting member 7 and make electrodes protruding in a vertical direction from the top surface-side of the supporting member 7. Mounting after completion is made easier by making the conductive terminals 17 protruding from the top surface-side of the supporting member 7 as described above. In the case where the pad electrodes 4 are formed above the device component 1, the through-holes 15 and the conductive terminals 17 may be formed in regions overlapping with the semiconductor substrate 2.

The conductive terminal 17 is not limited to being formed by the method described above, and may be formed by an electrolytic plating method using the metal layer 16 as a plating electrode or by a so-called dispense method (coating method) in which the solder or the like is applied using a dispenser. Also, the conductive terminal 17 may be made of gold, copper or nickel, and its material is not specifically limited.

Next, the supporting member 7 is cut along the dicing lines DL and separated into individual semiconductor devices 50. The method to separate into the individual semiconductor devices 50 includes a dicing method, an etching method, a laser cutting method and the like.

Figure 8:
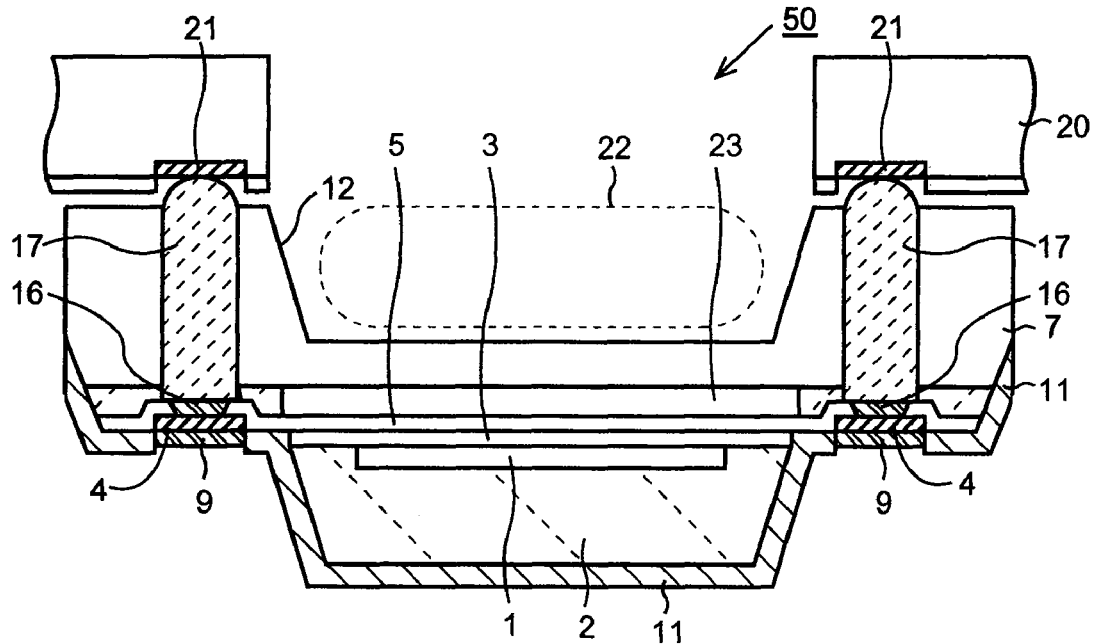
FIG. 8 is a cross-sectional view explaining a mounting status of the semiconductor device according to the first embodiment of this invention.

The completed semiconductor device 50 is mounted on another device on which external electrodes are formed in a pattern. For example, the conductive terminals 17 are directly connected to external electrodes 21 on a circuit board 20 such as a printed circuit board, as shown in FIG. 8. Although not shown in the drawing, there are cases in which the conductive terminal 17 is indirectly connected with an electrode of another device through a conductive material such as a bonding wire, a wiring or the like. In the case where protruding electrodes are formed in the other device, the connection may be made without forming the conductive terminals 17 and by placing the protruding electrode of the other device in the through-hole 15 as if the protruding electrode is buried in the through-hole 15. Also, the metal layer 9 may be connected with the electrode of the other device.

Since the depressed portion 12 is formed in the top surface of the supporting member 7 in the structure, there is a free space 22 above the bottom surface of the depressed portion 12. Therefore, a device in which the semiconductor device 50 is mounted can be reduced as a whole in thickness as well as in size, by utilizing the space 22 in the depressed portion 12. When the device component 1 is a light-receiving component, for example, the device as a whole can be reduced in size by disposing a filter material (a color filter or a filter that allows only specific wavelength of light to pass through, for example) or a lens on the bottom of the depressed portion 12.

It is also possible to dispose an electronic device such as a MEMS (Micro Electro Mechanical Systems) component on the bottom of the depressed portion 12. The MEMS means a device in which a mechanical component, a sensor, an actuator and an electronic circuit are integrated on a semiconductor substrate.

In FIG. 8, the adhesive layer 6 is partially formed and a cavity 23 is formed between the supporting member 7 and the semiconductor substrate 2. The cavity 23 is formed by applying a material to form the adhesive layer 6 in a ring-shape on the semiconductor substrate 2, for example.

Figure 9:
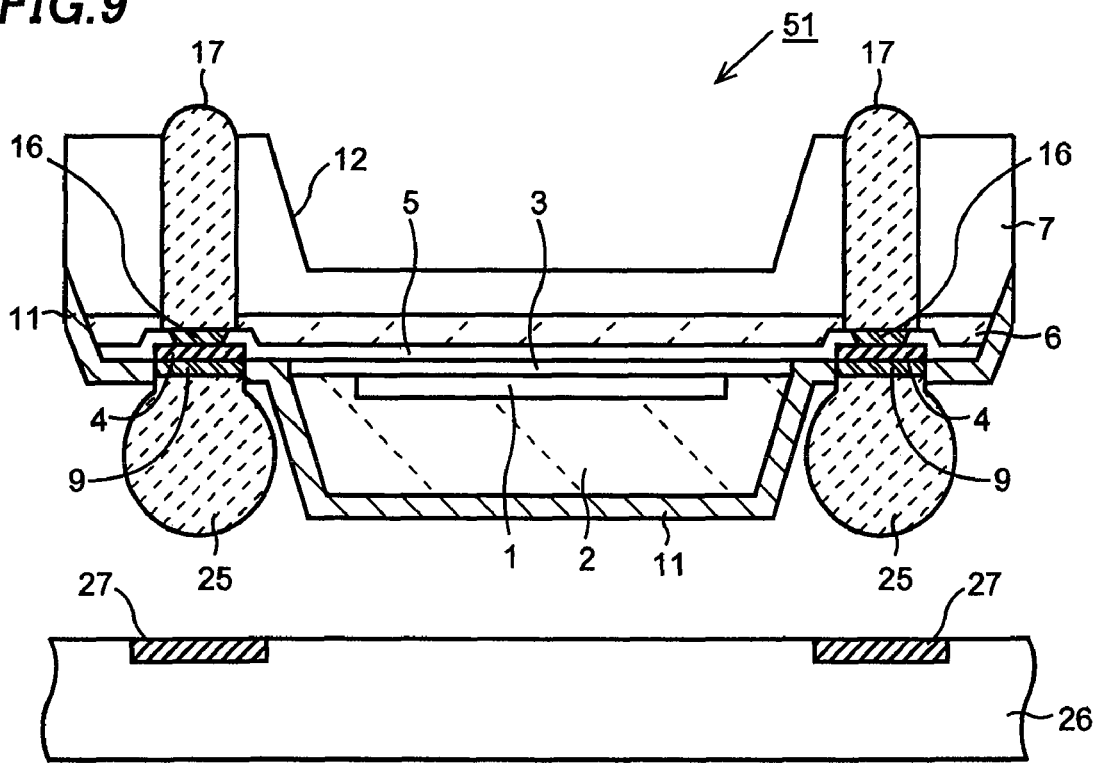
FIG. 9 is a cross-sectional view explaining the semiconductor device, its manufacturing method and a mounting status according to the first embodiment of this invention.

Also, there is a case in which a conductive terminal 25 is formed on the metal layer 9 exposed in the opening in the protection layer 11, as shown in FIG. 9. The conductive terminal 25 has the similar composition to the conductive terminal 17 described previously, and is made of solder or gold, for example. Also, the conductive terminal 25 may be formed by the screen-printing method, the plating method or the dispense method, as in the case of the conductive terminal 17. The conductive terminals 25 are formed in a semiconductor device 51, as shown in FIG. 9.

The semiconductor device 51 may be mounted through the conductive terminals 25 on a circuit board on which external electrodes are formed in a pattern. For example, the conductive terminals 25 are directly connected to external electrodes 27 on a circuit board 26 such as a printed circuit board, as shown in FIG. 9. Although not shown in the drawing, there are cases in which the conductive terminal 25 is indirectly connected with an external electrode through a conductive material such as a bonding wire or a wiring.

The wiring layer 107 and the second insulation film 16 extended over the side surface and the back surface of the semiconductor substrate in the conventional semiconductor device (FIG. 16) are not formed in the semiconductor devices 50 and 51. The reason is that it is preferable in terms of simplifying the manufacturing process to improve the productivity as well as suppressing the manufacturing cost compared with the structure in which the wiring layer and the insulation film are formed.

Figure 16:
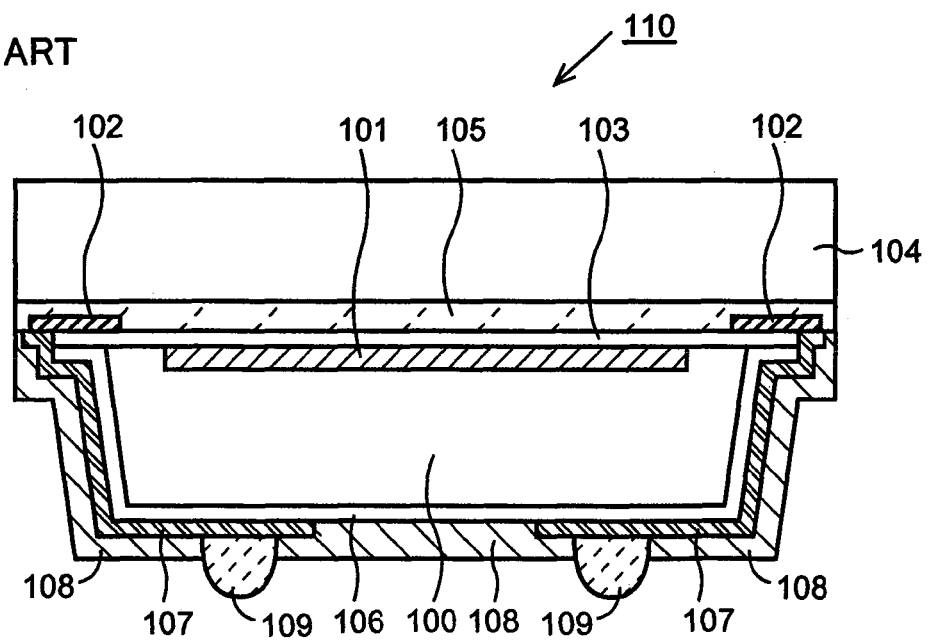
FIG. 16 is a cross-sectional view explaining a conventional semiconductor device.

When the conductive terminals 25 are formed, it is preferable to form the conductive terminal 25 at neighboring outside of the sidewall of the semiconductor substrate 2, as shown in the semiconductor device 51 in FIG. 9. It is because the semiconductor device can be reduced in thickness and size compared with the case in which the conductive terminals are formed on the back surface of the semiconductor substrate as in the conventional semiconductor device (FIG. 16).

Next, a stacked layer type semiconductor device in which a plurality of the completed semiconductor devices is vertically stacked will be explained referring to the drawings. The same components as those shown in the preceding drawings are denoted by the same symbols, and explanations on them are omitted or simplified.

Figure 10:
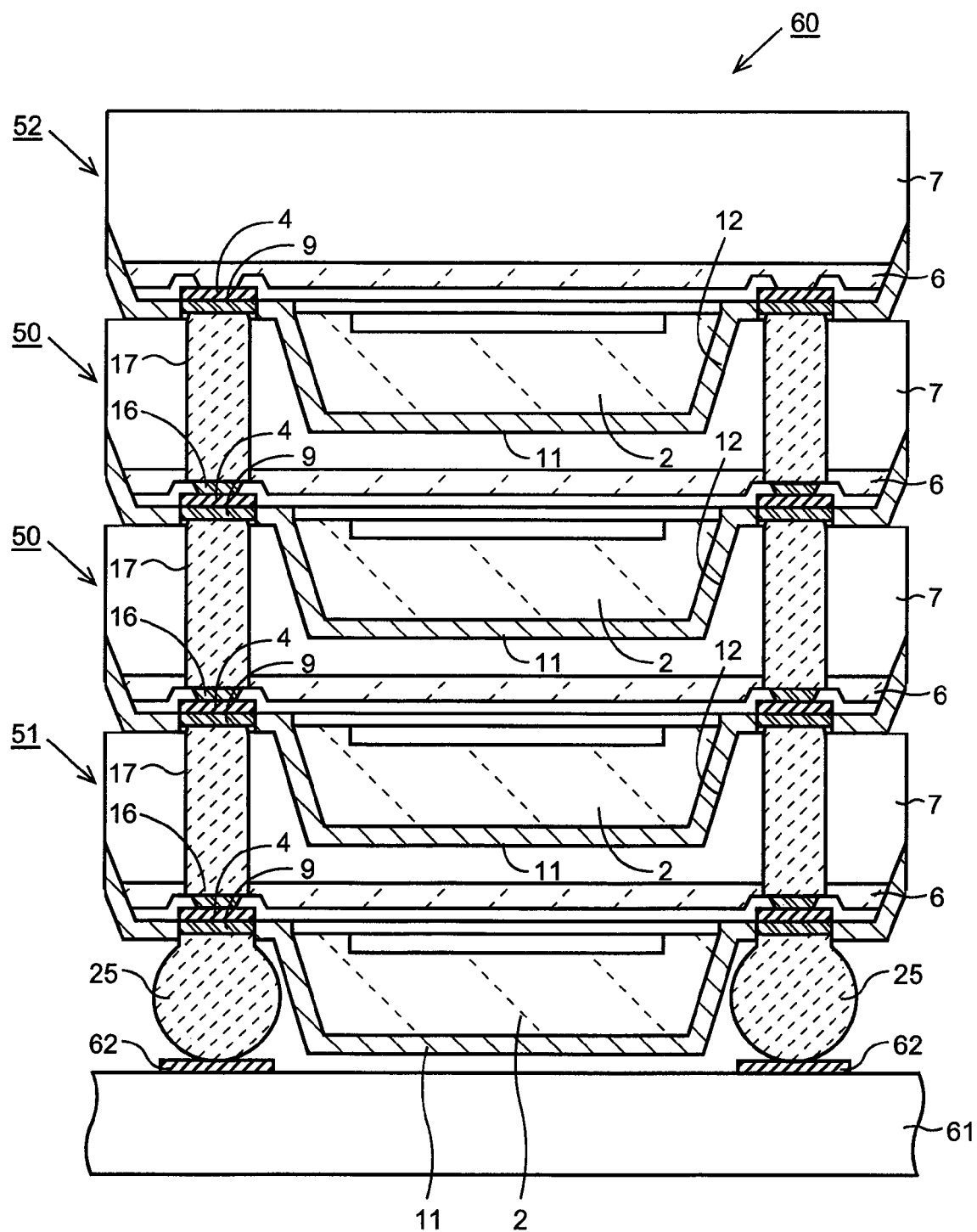
FIG. 10 is a cross-sectional view explaining a stacked layer type semiconductor device and its manufacturing method according to the first embodiment of this invention.

FIG. 10 is a cross-sectional view showing a stacked layer type semiconductor device 60 in which one semiconductor device 51, two semiconductor devices 50 and one semiconductor device 52 are stacked in the order as mentioned. The semiconductor device 52 has the same structure as the semiconductor device 50 except that the depressed portion 12, the through-hole 15 and the conductive terminal 17 are not formed in the supporting member 7.

The stacked layer type semiconductor device 60 is manufactured by a process described bellow after each of the semiconductor devices 50, 51 and 52 are completed. In order to obtain the stacked layer type semiconductor device of the minimum size, the width and the depth of the depressed portion 12 is adjusted so that all of the semiconductor substrate 2 including the protection layer 11 of the upper layer semiconductor device can be practically housed inside of the depressed portion 12.

First, the completed semiconductor devices (51, 51 and 52) are superposed onto each other so that each of the conductive terminals 17 is aligned to corresponding each of the metal layers 9, respectively. The upper layer semiconductor device is superposed onto the lower layer semiconductor device and fixed to it so that a portion of the upper layer semiconductor device is closely fitted into the space in the depressed portion 12 of the lower layer semiconductor device. And the stacked layer structure is completed by connecting the conductive terminals 17 with the metal layers 9 by a thermo-compression bonding method, for example. In the stacked layer type semiconductor device 60, the conductive terminals 25 of the semiconductor device 51 in the lowest layer are directly connected with the external electrodes 62 on the circuit board 61, for example.

In the stacked layer type semiconductor device according to this embodiment, the upper layer semiconductor device is electrically connected with the lower layer semiconductor device through the through-holes 15 provided in the supporting member 7, as described above. In addition, the portion of the upper layer semiconductor device is housed in the depressed portion 12 that is formed in the supporting member 7. As a result, a height of the stacked layer structure can be minimized.

The larger the number of layers in the stacked layer structure is, the greater the effect of the reduction in the thickness is. For example, when the thickness of the supporting member 7 is 100 μm and the thickness of the semiconductor substrate 2 is 50 μm, a total thickness of four layers of the conventional structure (FIG. 16) is about 600 (100×4+50×4) μm at least.

On the other hand, when four layers are stacked in the structure of the embodiment, its total thickness is about 450 (100× 4+50×1) μm.

Also, workability and efficiency are high because the semiconductor devices 50, 51 and 52 are ready to be stacked as soon as they are completed.

In addition, a manufacturing cost can be suppressed while productivity is improved, because process steps to form the wiring layer 107 and the second insulation film 106 that are required in the conventional art are not necessary in the embodiment. Furthermore, since the top surface of the semiconductor substrate 2 is protected with the supporting member 7, the device component 1 and its peripheral components formed on the top surface are prevented from deterioration, and reliability of the semiconductor device can be enhanced.

Figure 11:
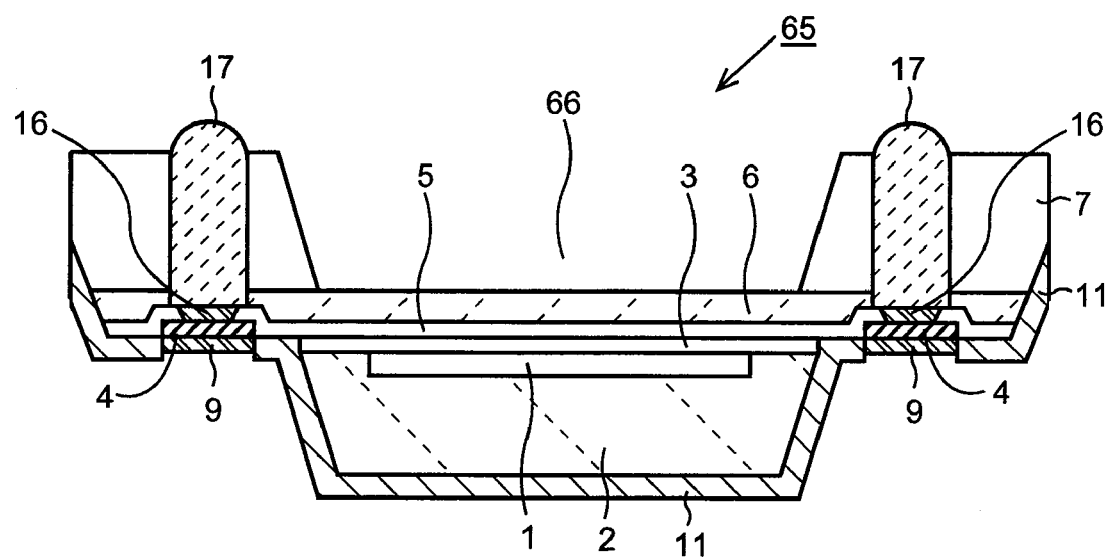
FIG. 11 is a cross-sectional view explaining a semiconductor device and its manufacturing method according to a second embodiment of this invention.

Next, a second embodiment of this invention will be explained referring to the drawings. The same structures as those already explained are denoted by the same symbols and explanations on them are omitted. FIG. 11 is a cross-sectional view showing a semiconductor device 65 according the second embodiment of this invention.

In the first embodiment, the depressed portion 12 is formed in the partial region of the top surface of the supporting member 7. In the second embodiment, on the other hand, it is characteristic of it that a through-hole 66 penetrating through the supporting member 7 from the top surface to the back surface is formed in a partial region of the supporting member 7. The through-hole 66 is different from the through-hole 15 that serves for electrically connection with another device, and offers a space to house all or a portion of another device.

The through-hole 66 for housing is formed by process steps similar to the process steps to form the depressed portion 12 in the first embodiment, for example. It may be formed simultaneously with the through-hole 15. To be more specific, it is formed by forming a resist layer on the supporting member 7 in a region where the through-hole 66 is to be formed, and dry-etching the top surface of the supporting member 7 in the direction of thickness using the resist layer as a mask, for example. Or, it may be formed by removing the top surface of the supporting member 7 by laser irradiation, wet etching or micro-blasting. A partial region of the adhesive layer 6 is exposed to outside by forming the through-hole 66.

Although not shown in the drawing, the exposed portion of the adhesive layer 6 may be removed after the through-hole 66 is formed. Or, the adhesive layer 6 may be formed at the time of its formation so that the adhesive layer 6 is not formed in the region where the through-hole 66 is to be formed. In some cases, operation quality of the semiconductor device is improved by not forming the adhesive layer 6 on the device component 1. When the device component is a light-receiving component or a light-emitting component, for example, its operation quality is improved because of the absence of unnecessary intervening material.

Figure 12:
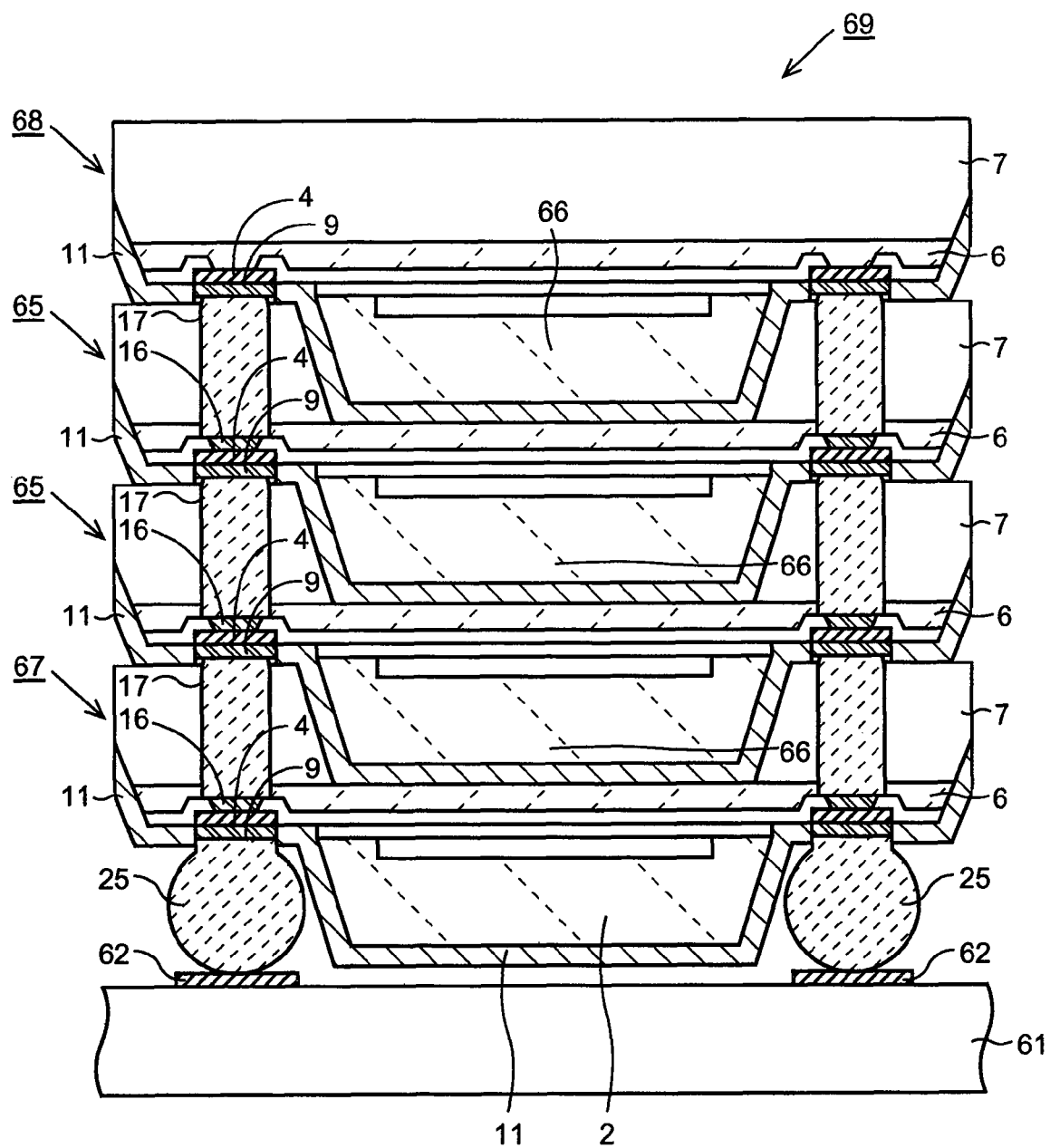
FIG. 12 is a cross-sectional view explaining a stacked layer type semiconductor device according to the second embodiment of this invention.

A stacked layer structure as shown in FIG. 12 can be formed by forming the through-holes 66 in the supporting member 7 as described above. FIG. 12 is a cross-sectional view showing a stacked layer type semiconductor device 69 in which one semiconductor device 67, two semiconductor devices 65 and one semiconductor device 68 are stacked in the order as mentioned. The semiconductor device 67 has the same structure as the semiconductor device 65 except that the conductive terminals 25 are formed. The semiconductor device 68 has the same structure as the semiconductor device 65 except that the through-hole 66, the through-hole 15 and the conductive terminal 17 are not formed in the supporting member 7.

Therefore, a device in which the semiconductor devices are mounted or stacked can be reduced as a whole in thickness as well as in size, by utilizing the space in the through-hole 66.

This invention is not limited to the embodiments described above and may be modified within the scope of the invention.

For example, although the through-holes 15, the metal layers 16 and the conductive terminals 17 are formed in the supporting member 7 at the locations corresponding to the pad electrodes 4, the locations are not limited to the above and they may be formed at any locations as long as they could serve as the connections with the electrodes of another device disposed above the semiconductor device.

The depressed portion 12 and the through-hole 66 may be formed into any shape. Also, a plurality of them may be formed. Therefore, stacking semiconductor devices different from each other in function or size is also possible. The upper layer device is not necessarily fitted tightly into the depressed portion 12 or the through-hole 66, and there may be a space between them. When the semiconductor devices different in size from each other are stacked, they can be stacked so that all of the upper layer semiconductor device is housed in the depressed portion 12 or in the through-hole 66.

Although an edge of the semiconductor substrate 2 and an edge of the pad electrode 4 are apart from each other in the explanation described above, it is also possible to etch the semiconductor substrate 2 so that the edge of the pad electrode 4 is disposed on a portion of the top surface of the semiconductor substrate 2.

Figure 13:
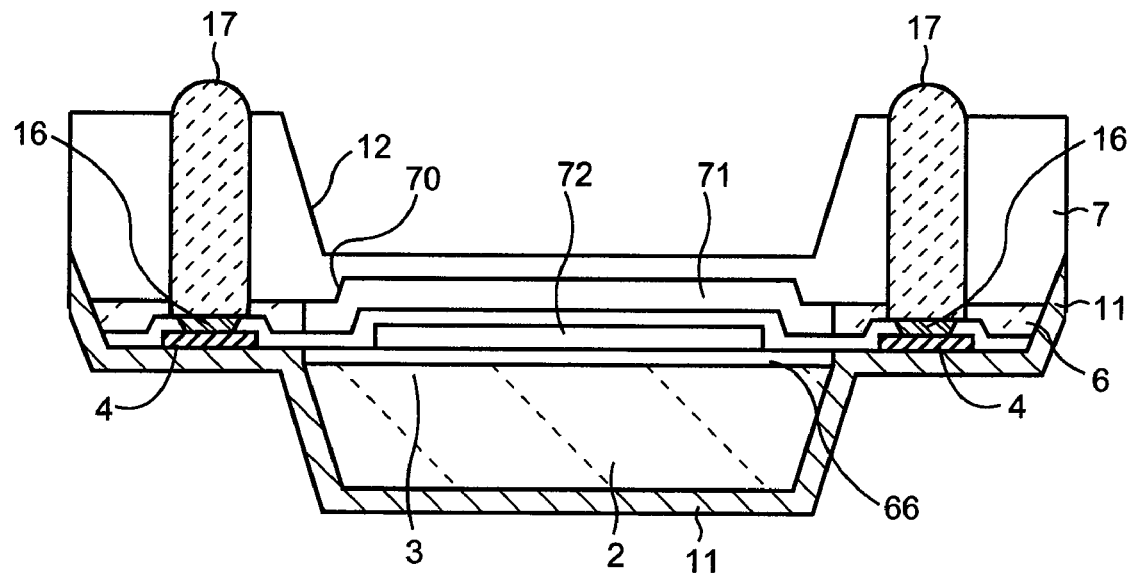
FIG. 13 is a cross-sectional view explaining a modified example of the semiconductor device of this invention.

Also, the surface of the supporting member 7 facing the semiconductor substrate 2, that is, the surface opposite to the surface on which the depressed portion 12 is formed, may be processed by etching, laser beam irradiation, micro-blasting or the like to form a depressed portion 70, as shown in FIG. 13. In this case, however, careful attention has to be paid to the process so that the supporting member 7 would not be destroyed by making the depressed portion 70 and the depressed portion 12 contiguous, for example. By forming the depressed portion 70 in the surface facing the semiconductor substrate 2, the space between the semiconductor substrate 2 and the supporting member 7 in the region where the depressed portion 70 is formed can be extended. In FIG. 13, the adhesive layer 6 is formed not uniformly but partially, and a cavity 71 is formed between the supporting member 7 and the semiconductor substrate 2. It is also possible to form a MEMS component 72 on the semiconductor substrate 2 through the insulation film 3 utilizing the cavity 71. At that time, the MEMS component 72 can be electrically connected with the pad electrode 4 through a wiring.

Figure 14:
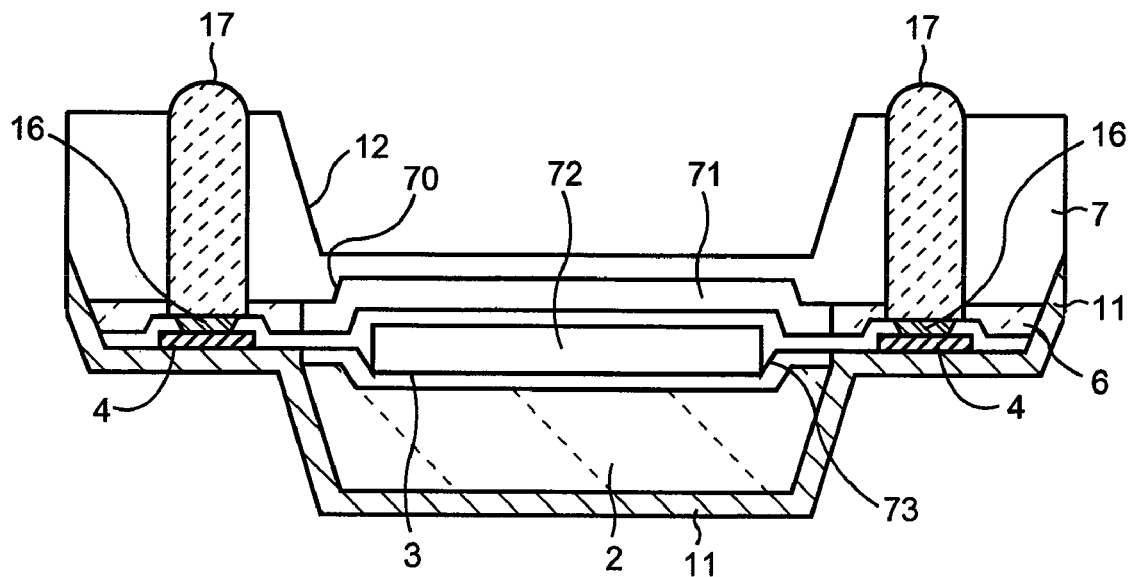
FIG. 14 is a cross-sectional view explaining a modified example of the semiconductor device of this invention.

It is also possible that a depressed portion 73 as shown in FIG. 14 is formed in the top surface of the semiconductor substrate 2 by etching, laser beam irradiation or the like and that various components including the MEMS component are formed on a bottom surface of the depressed portion 73. A thicker device can be formed on the semiconductor substrate 2 in the structure described above compared with the structure in which the depressed portion 73 is not formed in the semiconductor substrate 2, since the space between the semiconductor substrate 2 and the supporting member 7 is extended by a height of a step of the depressed portion 73. It is also possible to freely adjust the space between the supporting member 7 and the semiconductor substrate 2 by combining an adjustment to the height of step of the depressed portion 73 with an adjustment to the thickness of the adhesive layer 6 and the depressed portion 70 in the back surface of the supporting member 7.

Note that FIG. 13 and FIG. 14 show the structure in which the metal layer 9 is not formed and the protection layer 11 covers the pad electrodes 4.

Figure 15:
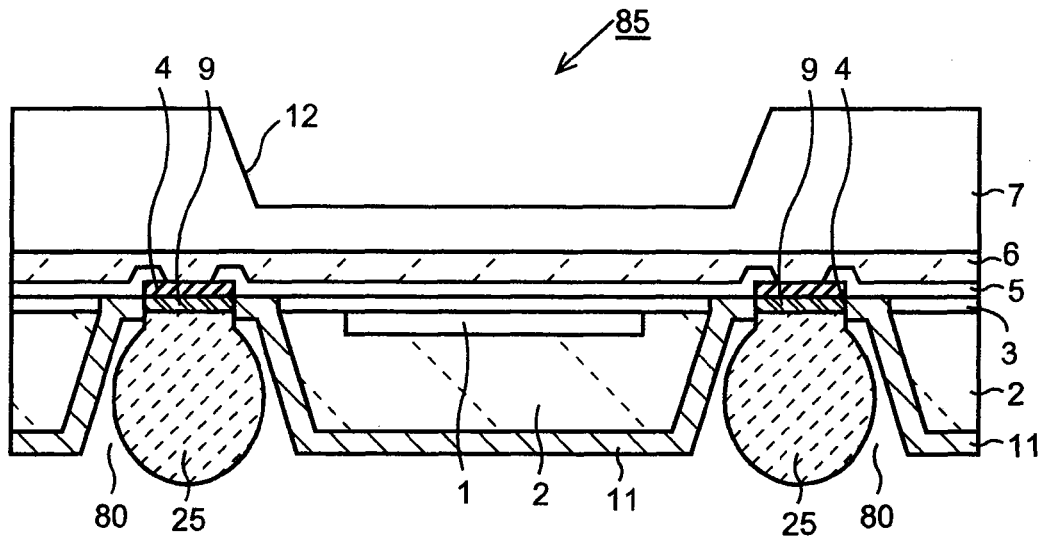
FIG. 15 is a cross-sectional view explaining a modified example of the semiconductor device of this invention.

Also, openings 80 may be formed as shown in FIG. 15 by changing the etching pattern of the semiconductor substrate 2 and the locations of the dicing lines. The openings 80 are surrounded by the semiconductor substrate 2. The conductive terminals 25 are formed in the openings 80. The conductive terminals 25 in a semiconductor device 85 according to a modified example are exposed to a back surface-side of the semiconductor device 85 but not exposed to a side surface-side. As a result, infiltration of contaminating material and mechanical damage are reduced to improve the reliability of the semiconductor device. Although not shown in the drawing, it is possible as a matter of course that the through-hole 15 or the through-hole 66 is formed in the supporting member 7 in the structure having the openings 80 shown in FIG. 15. It is also possible to form a stacked layer type semiconductor device as shown in FIG. 10 and FIG. 12 using the semiconductor device 85.

Although BGA (Ball Grid Array) type semiconductor devices are explained in the explanations described above, this invention may be applied to LGA (Land Grid Array) type semiconductor devices, other CSP type semiconductor devices and flip chip type semiconductor devices.

The invention claimed is:

1. A semiconductor device comprising:
 a semiconductor substrate comprising an electronic component formed on a top surface of the semiconductor substrate;
 a supporting member having a bottom surface and a top surface and bonded to the semiconductor substrate;
 an adhesive layer attaching the bottom surface of the supporting member to the top surface of the semiconductor substrate; and
 an electrode disposed on the bottom surface of the supporting member and electrically connected with the electronic component,
 wherein the supporting member comprises a depressed portion formed from the top surface of the supporting member.

2. The semiconductor device of claim 1, wherein the supporting member has a through-hole penetrating through the supporting member, and the electrode is electrically connected with an electrode of another device through the through-hole.

3. The semiconductor device of claim 1, further comprising a first conductive terminal electrically connected with the electrode and provided in the through-hole in the supporting member, wherein the first conductive terminal protrudes from the top surface of the supporting member through the through-hole.

4. The semiconductor device of claim 1, further comprising a protection layer covering the semiconductor substrate and having an opening at the electrode, and a second conductive terminal electrically connected with the electrode through the opening in the protection layer.

5. The semiconductor device of claim 1, further comprising a MEMS component or a filtering material disposed in the depressed portion of the supporting member.

6. The semiconductor device of claim 1, wherein the adhesive layer is partially formed so as to form a cavity between the semiconductor substrate and the supporting member.

7. A semiconductor device comprising:
 a semiconductor substrate comprising an electronic component formed on a top surface of the semiconductor substrate;

a supporting member having a bottom surface and a top surface and bonded to the semiconductor substrate;

an adhesive layer attaching the bottom surface of the supporting member to the top surface of the semiconductor substrate; and an electrode disposed on the bottom surface of the supporting member and electrically connected with the electronic component;

wherein the supporting member has a first through-hole connecting the top and bottom surfaces of the supporting member and provided therein with a first conductive terminal electrically connected with the electrode and a second through-hole not provided with the first conductive terminal and configured to house all or a portion of another device.

8. The semiconductor device of claim 7, further comprising a protection layer covering the semiconductor substrate and having an opening at the electrode, and a second conductive terminal electrically connected with the electrode through the opening in the protection layer.

* * * * *